United States Patent

Todokoro

[11] Patent Number: 4,772,847
[45] Date of Patent: Sep. 20, 1988

[54] STROBOSCOPIC TYPE POTENTIAL MEASUREMENT DEVICE

[75] Inventor: Hideo Todokoro, Tokyo, Japan

[73] Assignee: Hitachi, Ltd., Tokyo, Japan

[21] Appl. No.: 852,751

[22] Filed: Apr. 16, 1986

[30] Foreign Application Priority Data

Apr. 17, 1985 [JP] Japan .................................. 60-80156
Apr. 17, 1985 [JP] Japan .................................. 60-80162

[51] Int. Cl.$^4$ ....................... G01R 19/00; G01R 31/02
[52] U.S. Cl. .................................. 324/158 R; 250/310
[58] Field of Search ....................... 250/310, 311, 492.2; 324/158 R, 73 R, 158 D, 130; 307/511; 328/55, 155, 151, 228; 364/577

[56] References Cited

U.S. PATENT DOCUMENTS

| 3,678,384 | 7/1972 | Oatley | 324/130 |
| 3,771,056 | 11/1973 | Zimmerman | 324/130 |
| 3,795,008 | 2/1974 | Kolsrud et al. | 328/151 |
| 3,896,390 | 7/1975 | Bumgardner | 328/151 |
| 3,965,744 | 6/1976 | Gutjahr | 324/130 |
| 4,134,029 | 1/1979 | Bright et al. | 328/155 |
| 4,370,643 | 1/1983 | Kitamura | 328/151 |
| 4,602,243 | 7/1986 | Von Bergen et al. | 328/151 |
| 4,620,136 | 10/1986 | Bolger | 315/371 |
| 4,625,286 | 11/1986 | Papamichalis et al. | 364/513.5 |

FOREIGN PATENT DOCUMENTS

| 0156870 | 9/1983 | Japan | 324/158 R |
| 0117836 | 7/1984 | Japan | 364/577 |
| 0117640 | 6/1985 | Japan | 250/492.2 |
| 7801226 | 8/1978 | Netherlands | 364/577 |

OTHER PUBLICATIONS

"Stroboscopic Scanning Electron Microscope with 1 KeV Electrons", by Tokodoro et al. Scan. Elect. Micros., 1983., pp. 561-8.
"Quantitative Measurement with High Time Resolution of Internal Waveforms on MOS RAM's Using a Modified Scanning Electron Microscope", by Feuerbaum et al., IEEE, vol. SC-13, Journal of Solid-St. Ckts., #3, 6/78, pp. 319-325.

*Primary Examiner*—Reinhard J. Eisenzopf
*Assistant Examiner*—W. Burns
*Attorney, Agent, or Firm*—Antonelli, Terry & Wands

[57] ABSTRACT

A stroboscopic type potential measurement device is disclosed, in which a waveform of a periodically varying voltage at a location irradiated with a charged particle pulsed beam is measured by using the charged particle pulsed beam synchronized with a periodically varying voltage in a sample and varying the relation in the phase between the periodically varying voltage in the sample and the charged particle pulsed beam. In order to reproduce a potential waveform, which is close to the original waveform, two sorts of measurements having different phase division pitches are effected and a measurement result is formed by combining a measurement result obtained by using a coarse phase division and that obtained by using a fine phase division. A phase scanning with the coarse phase division pitch is repeated for every fine phase division pitch.

5 Claims, 7 Drawing Sheets

STROBOSCOPIC TYPE POTENTIAL MEASUREMENT DEVICE

BACKGROUND OF THE INVENTION

This invention relates to a potential measurement device using an electron beam and in particular to a stroboscopic type potential measurement device permitting the measurement of variations of potentials (potential waveforms) on interconnection lines in LSI by using charged particles of a scanning electron microscope and so forth.

Initially, the principle of the stroboscopic type potential measurement device will be explained.

Figure 1:
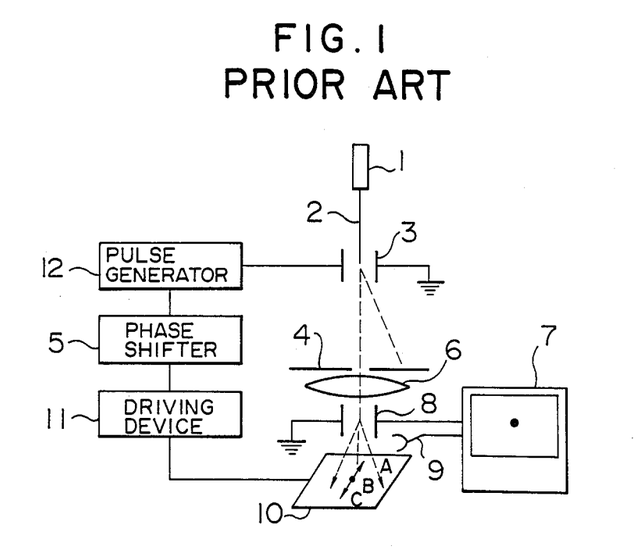
FIG. 1 is a scheme illustrating the construction of a stroboscopic type scanning electron microscope.

FIG. 1 is a schematic illustrating the fundamental construction of a stroboscopic type scanning electron microscope for measuring potential waveforms by using a pulsed electron beam. An electron beam 2 emitted by an electron gun 1 is focused on a sample under test 10 by means of an electron lens 6 and scanned by means of a deflector or scanning coil 8 a manner similar to a television display tube. When an electron beam collides against a solid body, reflected electrons or secondary electrons are produced. These are detected by a detector 9 and their image is displayed on a display device 7. This is the principle of the scanning electron microscope.

Figure 2A:
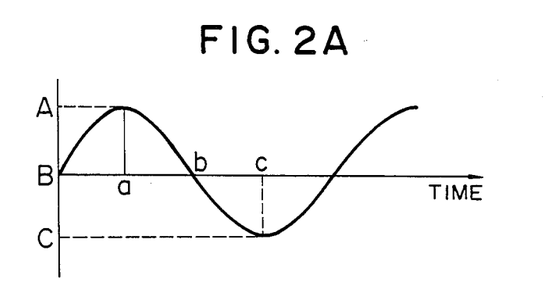
FIGS. 2A and 2B are schemes for explaining the work of the microscope indicated in FIG. 1, FIG. 2A being a waveform diagram indicating the relation between the location irradiated with the electron beam and the time, FIG. 2B indicating representations on a display device.
Figure 2B:
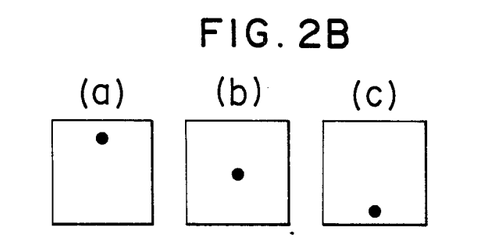

When a sample varying with a high speed is observed by means of this scanning electron microscope, the scanning of the electron beam by the deflector 8 cannot follow the variations of the sample therefore, all the variations are displayed superposed on each other. Consequently a pulse gate (combination of the deflector 3 and an aperture 4) is added, which chops the electron beam by means of a pulse generator synchronized with a driving device 11 giving the variations to the sample. By using such a construction the electron beam, with which the sample is scanned, can be controlled so that the sample is irradiated therewith only at a predetermined phase of the variations of the sample in order to detect the state of the sample only at the moment that the sample is irradiated. FIGS. 2A and 2B are schemes for explaining the above mentioned operation. The abscissa of FIG. 2A represents variations of the state of the sample, where the object is displaced between A and C, and the ordinate the time. Supposing that the phase (Timing), where the sample is irradiated with the electron beam, is a point of time a, the sample is observed on the display device 7, as indicated in FIG. 2B (a). Similarly, when the phase of irradiation is points of time b and c in FIG. 2A, the sample is observed, as indicated in FIG. 2B (b) and (c), respectively. The phase, where the sample is observed, can be selected by means of a phase shifter 5 indicated in FIG. 1. In general, the phase shifter 5 is constituted by combinations of delay lines.

Principal applications of the stroboscopic type scanning electron microscope are observations of potential varying with a high speed in LSI. In this case an energy analyzer for secondary electrons is added between the detector 9 and the sample 10.

Figure 3A:
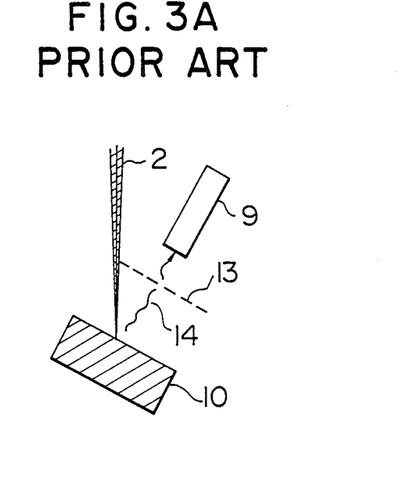
FIG. 3A is a scheme illustrating the construction of a potential measurement device by means of an electron beam.
Figure 3B:
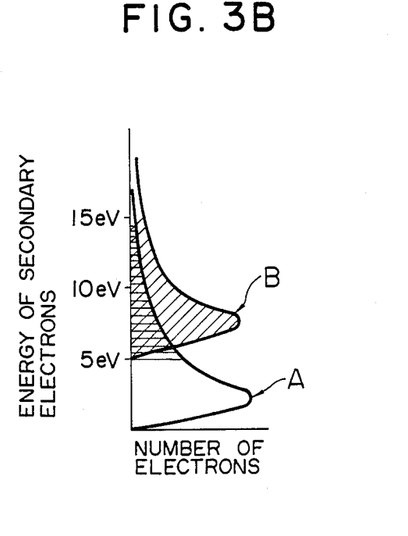
FIG. 3B indicates characteristic curves showing the relation between the number of electrons detected by the potential measurement device indicated in FIG. 3A and the energy of secondary electrons.

FIG. 3A illustrate this principle, in which a control electrode 13 is disposed between the sample under test 10 and the detector 9 opposed thereto. The control electrode 13 forms a potential barrier for discriminating energy of secondary electrons emitted by the sample 10 irradiated with the electron beam 2. FIG. 3B is a scheme for explaining the operation of this potential barrier. In the case where no control electrode 13 is disposed over the sample, all the secondary electrons are detected by the detector 9. Energy of the secondary electrons emitted by the sample 10 of zero potential is distributed as indicated by A in FIG. 3B. When the potential of the sample 10 is −5 V, the distribution is changed as indicated by B. When the control electrode 13, to which −5 V is applied, is disposed, since detected secondary electrons are limited to those whose energy is higher than 5 eV, the amount of the detected secondary electrons varies, depending on the potential of the sample 10. Since the amount of the detected secondary electrons depends on the sample potential, inversely the potential of the sample 10 can be known from the amount of the detected secondary electrons.

However, by the potential measurement, for which only the control electrode 13 described above is disposed, the relationship between the potential of the sample 10 and the amount of the detected secondary electrons is not linear and therefore it is difficult to measure the potential quantitatively.

Consequently, in order to obtain a linear relationship therebetween, a feedback method is utilized, by which the potential of the control electrode is so regulated by means of an electronic circuit that the amount of the detected secondary electrons is maintained at a constant. (cf. IEEE, Journal of Solid State Circuits, vol. SC-13, No. 3, 1978).

Figure 4:
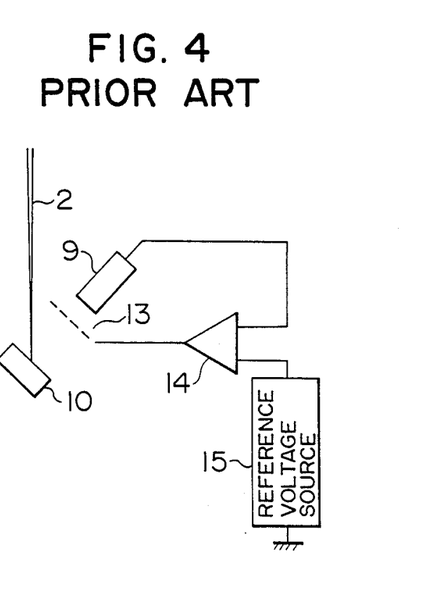
FIG. 4 is a scheme illustrating the construction of a potential measurement device for quantitative measurements of the potential.

FIG. 4 is a block diagram for explaining this feedback method. The output of the detector 9 is compared with a voltage of a reference voltage source 15 and the difference therebetween is amplified by an amplifier 14, the output of which is given to the control electrode 13. Since the feedback circuit is so constructed that, when the amount of the detected secondary electrons increases, the potential of the control electrode 13 decreases so that increase of the amount is suppressed, the amount of the detected secondary electrons maintained constant, however the potential of the sample 10 varies. In this way, since variations in the potential of the sample correspond one-to-one to variations in the potential of the control electrode 13, variations in the unknown potential of the sample can be determined quantitatively by measuring the potential of the control electrode 13.

When the phase of the phase shifter 5 indicated in FIG. 1 is varied slowly in a range from 0° to 360°, while measuring quantitatively the potential in the manner described above, a potential waveform corresponding to phase variations can be obtained. Regulation of the phase is effected by using a delay line, as stated previously. In this way, by using a stroboscopic type scanning electron microscope, it is possible to measure potential waveforms as by a sampling oscilloscope.

Figure 5:
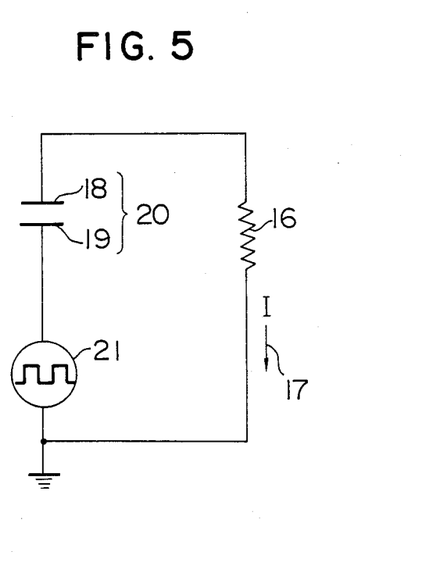
FIG. 5 is an equivalent circuit diagram of the device indicated in FIG. 4 in the case where an LSI is covered with a passivation film.

By the method described above it is possible to measure potential waveforms by means of an electron beam. It has been already stated that principal applications of the stroboscopic type scanning electron microscope are measurements of potential waveforms in LSIs. However, in many cases, an LSI is covered with an insulation film called passivation for protecting semiconductor circuits formed therein against dirt and humidity. Since this passivation film lies between the electron beam and the metallic electrodes in the LSI, it acts as a capacitor. Due to this interposition of a capacitance it is not possible to measure any stationary voltages (e.g. DC voltage). Consequently it is not possible to obtain any potential waveform by the method described above, in which the phase is regulated slowly. This aspect will be explained below, referring to FIGS. 5, 6A, 6B and 6C. FIG. 5 indicates a model representing the relation between the action of the capacitor formed by the passivation film and obtained signals. An electric current I 17 flows through a resistance 16 from an AC voltage source 21 through an electrostatic capacitance 20 formed between a spot irradiated with the electron beam and a conductor 19 in the LSI. The resistance 16 is an equivalent detection resistance. The amplitude of the AC voltage source 21 in this model is equal to the voltage in the LSI. However its frequency is not equal to the frequency in the LSI, instead the phase of the former is shifted by 360° with respect to that of the latter. In the case where the phase is fixed, a DC voltage is obtained. As it can be seen from this equivalent circuit, when the period for changing the phase is made as short as possible, the original waveform (waveform to be measured in the LSI) can be measured. Therefore, the inventors of this invention have ameliorated this method usually utilized, by which the whole phase is scanned in 10–40 seconds, and realized a method, by which the whole phase is scanned in 10–40 ms and measured values thus obtained are superposed about 1000 times (cf. Scanning Electron Microscopy, 1983, Vol. II, pp. 561–568. However, even by this method, when the passivation film is thick and conductors in the LSI still exist fine, difficulties are encasticed. An attempt to make the period for changing the phase still shorter causes the division of the phase, i.e. the division in time become coarse and thus is becomes impossible to measure waveforms in detail.

SUMMARY OF THE INVENTION

The object of this invention is to provide a stroboscopic type potential measurement device to overcome the problem described above, to reproduce a waveform close to the original one and to measure it in detail.

The above object of this invention can be achieved by a stroboscopic type potential measurement device comprising a charged particle beam projecting means irradiating a sample with a charged particle pulsed beam synchronized with a periodically varying voltage in the sample; a phase shifter means varying the phase of the charged particle pulsed beam with respect to that of the periodically varying voltage in the sample; and a potential measurement means detecting secondary electrons emitted by the sample irradiated with the charged particle pulsed beam and measuring a waveform of a periodically varying voltage at a location irradiated with the charged particle pulsed beam; whereby the potential measurement means regulates the phase of the charged particle pulsed beam with respect to that of the periodically varying voltage in the sample by means of the phase shifter means and effects at least 2 sorts of measurements having different phase division pitches; a measurement being so effected that a measurement result is formed by combining a measurement result obtained by using a coarse phase division and that obtained by using a fine phase division or that the phase shifter means repeats phase scannings having a coarse phase division pitch while phase-shifting with a fine phase division pitch interpolating this coarse phase scanning pitch interval.

Here "a coarse phase division" means one having such an interval that, when the sample is irradiated with a charged particle beam, it is possible to effect correct potential measurement regardless of electric charge stored on the insulating film of the sample and that it is always possible to see the whole aspect of the potential waveform. To the contrary, "a fine phase division" means one having such an interval that, when the sample is irradiated with a charged particle beam, it becomes impossible to effect correct potential measurement because of electric charge stored on the insulating film of the sample.

DETAILED DESCRIPTION OF THE PREFERRED EMBODIMENTS

Before explaining the preferred embodiments, the general principle of this invention will be explained.

Figure 6A:
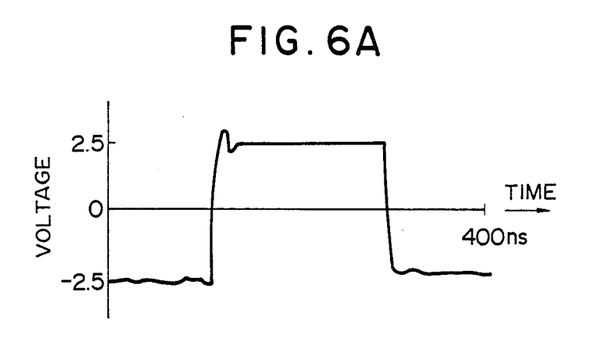
FIG. 6A is a voltage waveform diagram.
Figure 6B:
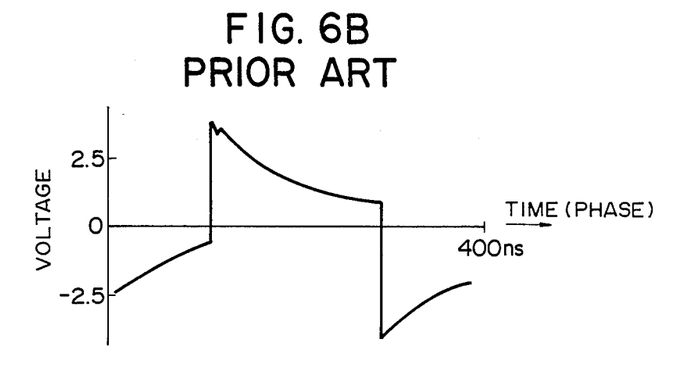
FIG. 6B a corresponding diagram in the case where measurement is effected by the prior art method, FIG. 6C a corresponding diagram in the case where measurement is effected with a coarse phase division pitch.
Figure 6C:
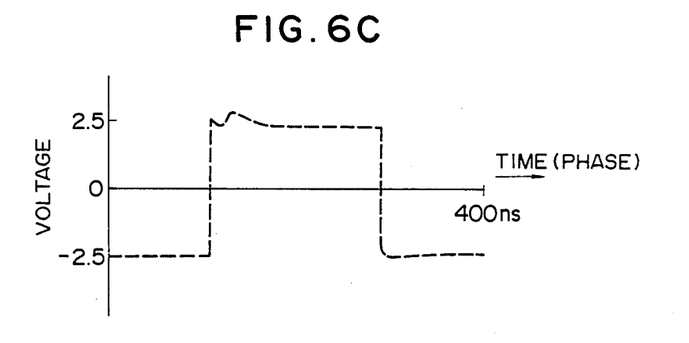

FIG. 6A shows the original potential waveform in an LSI and FIG. 6B indicates a measurement result obtained by a prior art method. Measurements are effected, dividing a whole period of 400 ns into steps of 0.4 ns (1000 divisions). Since the time necessary for scanning one phase step is 10 μs, the time necessary for scanning the whole phase (400 ns) is 10 ms. These parameters are typical values. However, with this scanning speed of 10 ms a differentiated waveform, as indicated in FIG. 6B, is obtained because of the passivation film.

In order to increase further the phase scanning speed, it is sufficient to shorten the time necessary for one step, but it is difficult to obtain a time necessary for one step shorter than 10 μs. Accordingly, although a whole period remains to be 400 μs, when measurements are effected in steps of 16 ns, a whole phase can be scanned in 250 μs. It is possible to obtain a waveform which is almost not differentiated, by scanning with such a high speed. However, since the number of divisions is 25 and thus the division is fairly rough, the result obtained is not satisfactory as waveform measurements. According to this invention, by effecting corrections so that the waveform indicated in FIG. 6B becomes in accordance with what indicated in FIG. 6C, a waveform, which is not differentiated and represents a measurement result, whose division is sufficiently fine, can be obtained.

Figure 7:
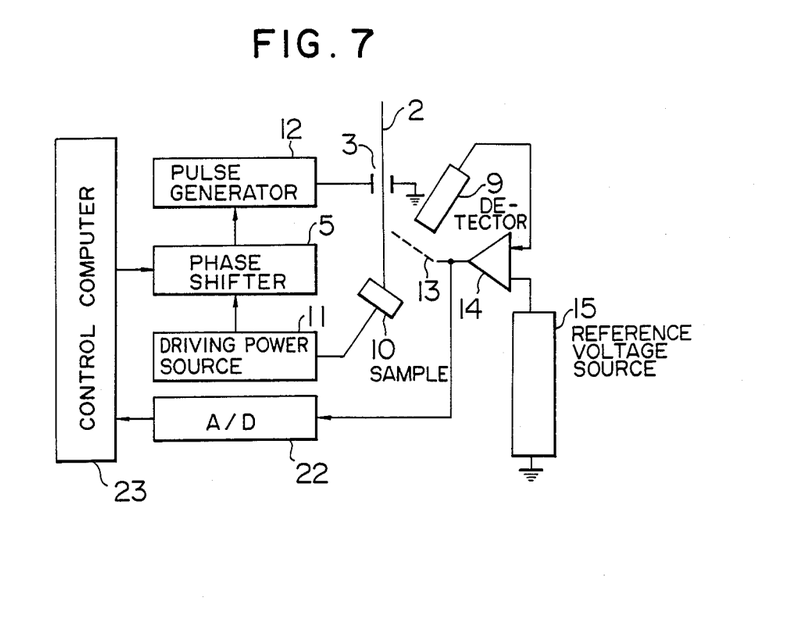
FIG. 7 is a scheme illustrating the construction of a stroboscopic type potential measurement device showing an embodiment of this invention.
Figure 8:
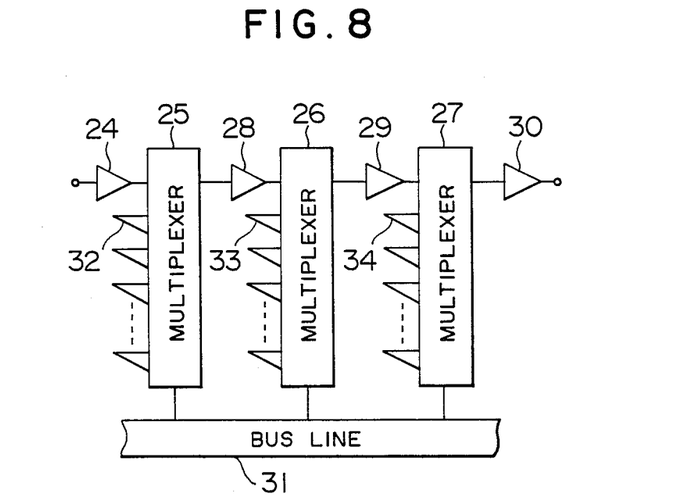
FIG. 8 is a circuit diagram showing an example of the delay circuit.

FIG. 7 represents an embodiment of this invention. In this embodiment the sample 10 is an LSI driven by a driving power source 11. The trigger output signal coming from the driving power source 11 is delayed (phase-regulated) by a phase shifter 5 controlled by a control computer 23 and inputted to a pulse generator 12 pulsating the electron beam. Secondary electrons emitted at the location irradiated with the electron beam in the sample 10 are detected through a control grid 13 by a detector 9. The control grid 13 is feedback-controlled by means of an amplifier 14 and a reference voltage source 15. The potential of the control grid 13, which is the output of the measurement is inputted through an A/D transformation circuit 22 to the control computer 23. The phase shifter 5 used for this embodiment is constructed as indicated in FIG. 8. The trigger output signal coming from the driving power source 11 is inputted to a buffer amplifier 24. After the buffer amplifier 3 rows of multiplexers 25, 26, 27 are provided one after another. Also between the multiplexers and at the output of the last multiplexer 27 are disposed buffer amplifiers 28, 29, 30. The multiplexers 25, 26, 27 are controlled by a 4-bit signal through a bus line 31 of the control computer 23. The first stage multiplexer 25 is provided with 15 delay lines 32 of 0.1 ns, the middle stage multiplexer 26 with 15 delay lines 33 of 1.6 ns, and the last stage multiplexer with 15 delay lines 34 of 25.6 ns so that a delay of 409.5 ns in total can be obtained by combining them.

The operation of the phase shifter 5 will be explained below by taking a measurement of a waveform, whose period is 409.5 ns, as an example. At first a delay of 409.5 ns at most is given with an interval of 12.8 ns. For example the gate of the A/D transformation circuit 22 is opened at a delay of 0 ns and data are taken in. Next data are similarly taken in with a delay of 12.8 ns. This procedure is repeated in the same way up to a delay of 409.5 ns. The whole process described above is repeated e.g. 4096 times in order to obtain a waveform. Since one take-in of the data requires 10 μs, this waveform measurement is terminated in 1.3 s. Next a measurement is effected up to 409.5 ns with an interval of 0.4 ns. This measurement requires 40 s. At the former measurement one phase scanning requires only 0.32 ms and thus it is possible to obtain a waveform, which is scarcely influenced by a passivation film. As already explained, corrections of the waveform of the latter measurement are effected by using the waveform obtained by the former measurement.

Figure 9:
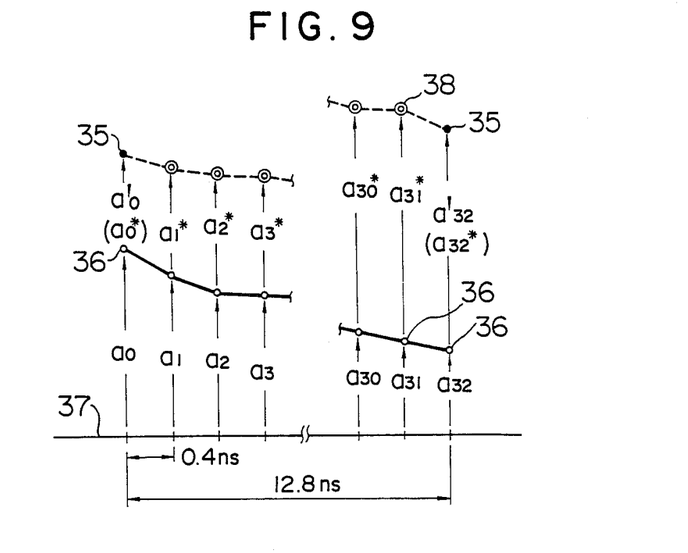
FIG. 9 is a diagram for explaining a potential measurement method, which is an example of this invention.

A practical correction method will be explained referring to FIG. 9. Black circles represent points of the measurement effected with an interval of 12.8 ns and white circles indicate those obtained with an interval of 0.4 ns. Suppose that every measurement point has a value measured from a reference line 37 as indicated in the figure. a*s represent values after the correction and can be obtained as follows.

$$a^*_0 = a_0 + (a_0' - a_0)$$

$$a^*_1 = a_1 + (a_0' - a_0) + \{(a_{32}' - a_{32}) - (a_0' - a_0)\} \times \frac{1}{32}$$

$$\vdots$$

$$a^*_n = a_n + (a_0' - a_0) + \{(a_{32}' - a_{32}) - (a_0' - a_0)\} \times \frac{n}{32}$$

$$\vdots$$

$$a^*_{32} = a_{32} + (a_{32}' - a_{32})$$

The above process means that the white circles are corrected with a straight line passing through the two black circles 35. Double circles 38 in the figure indicate corrected measured points.

In order to effect a more precise correction, a logarithmic approximation is useful. In this case experimental conditions (irradiation electron beam intensity, the passivation film, etc.) should be taken into consideration in the calculation.

Figure 10:
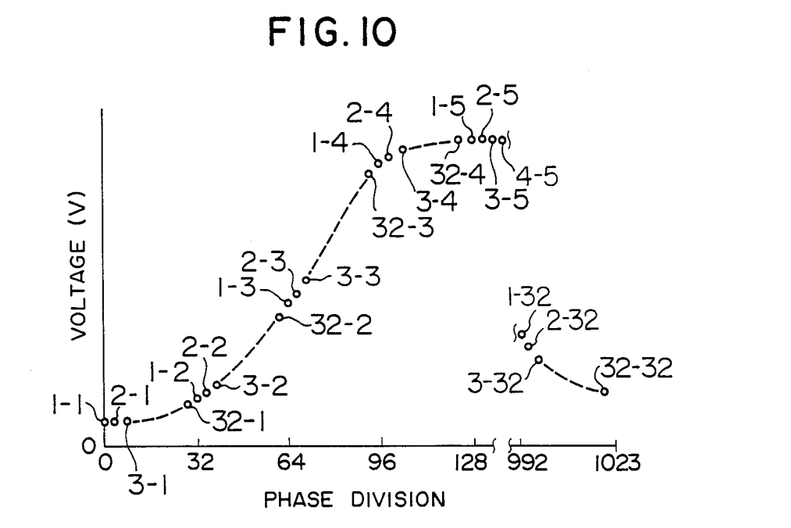
FIG. 10 is a diagram for explaining a potential measurement method, which is another example of this invention.

FIG. 10 shows another phase scanning method for the device indicated in FIG. 7. The ordinate of this graph represents the measured potential and the abscissa indicates the phase division, which is the channel number of a memory (not shown in the figure) in the control computer 23. When the amount of variation in phase per channel is 0.4 ns, the whole coordinate corresponds to 409.5 ns. At first the sample is irradiated with the electron beam 2, while giving it phase variations by 12.8 ns one after another by controlling the phase shifter 5 and data thus obtained corresponding to 1-1, 1-2, . . . , 1-32 are taken in the memory of the control computer 23 for every 32 channels. Usually data having an excellent S/N ratio can be obtained by summing these data about 4000 times. Then, the sample is irradiated with the electron beam 2, while giving it a phase variation, which is equally 12.8 ns but shifted by 0.4 ns from the phase used previously and data thus obtained corresponding to 2-1, 2-2, . . . , 2-32 always for every 32 channels but for the channels, which are advanced by 1 with respect to the channels used previously, are taken in the memory. This process is repeated successively 32 times. In this way all the 1024 channels are filled and a measurement is terminated. Although in this embodiment the measurement has been shifted by 1 channel the channels can be selected at random. In summary the measurement is effected with a large pitch and in such a manner that all the channels are filled.

Hereinbelow, an example for the measurement of a waveform, whose period is 409.5 ns, will be explained together with an example of the phase shifter indicated in FIG. 8. The number of channels of the memory in the control computer 23 is supposed to be 1024. For the 0-th channel of the memory in the computer none of the multiplexers operate and all the delay lines are short-circuited and data are taken in the memory (0-th channel). Next the measurement proceeds to the 31st channel. At this time 8 of the delay lines 33 in the multiplexer 26 are opened, which gives rise to a delay of 12.8 ns and data are taken in the memory (31st channel). Then the measurement proceeds to the 61st channel. This procedure is repeated 32 times up to the 1023rd channel. After the termination of this one period of measurements, the measurement proceeds to the 1st channel. For the 1st channel only one of the delay lines of 0.1 ns in the multiplexer 25 is opened. After data have been taken into the memory, the measurement proceeds to the 32nd channel. Here, 4 of the delay lines 32 in the multiplexer 25 and 8 of the delay lines 33 in the multiplexer 26 are opened. This procedure is repeated, until all the 1024 channels of the memory are filled.

Figure 11:
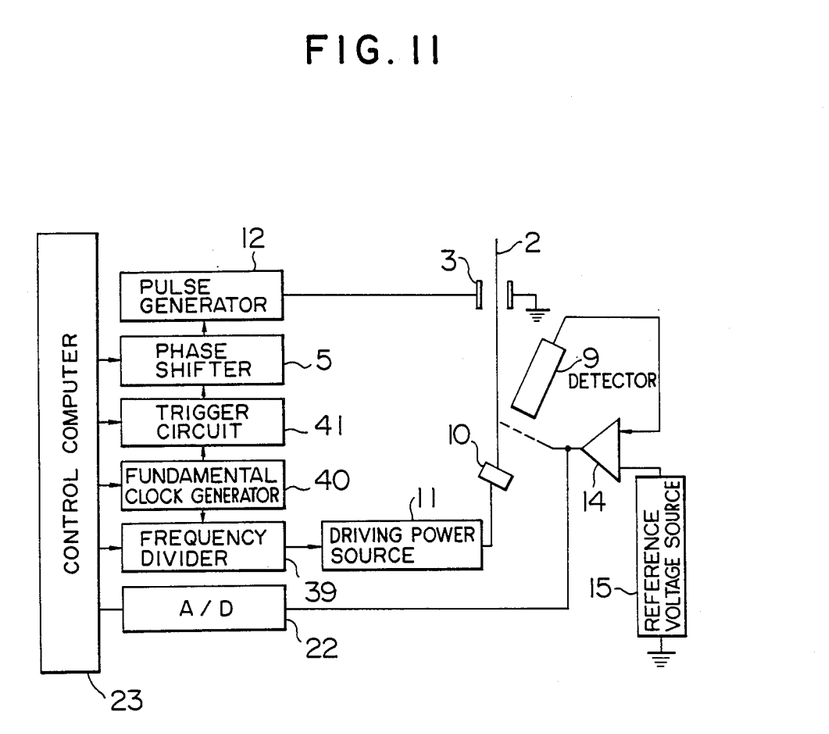
FIG. 11 is a scheme illustrating the construction of a stroboscopic type potential measurement device showing another embodiment of this invention.
Figure 12:
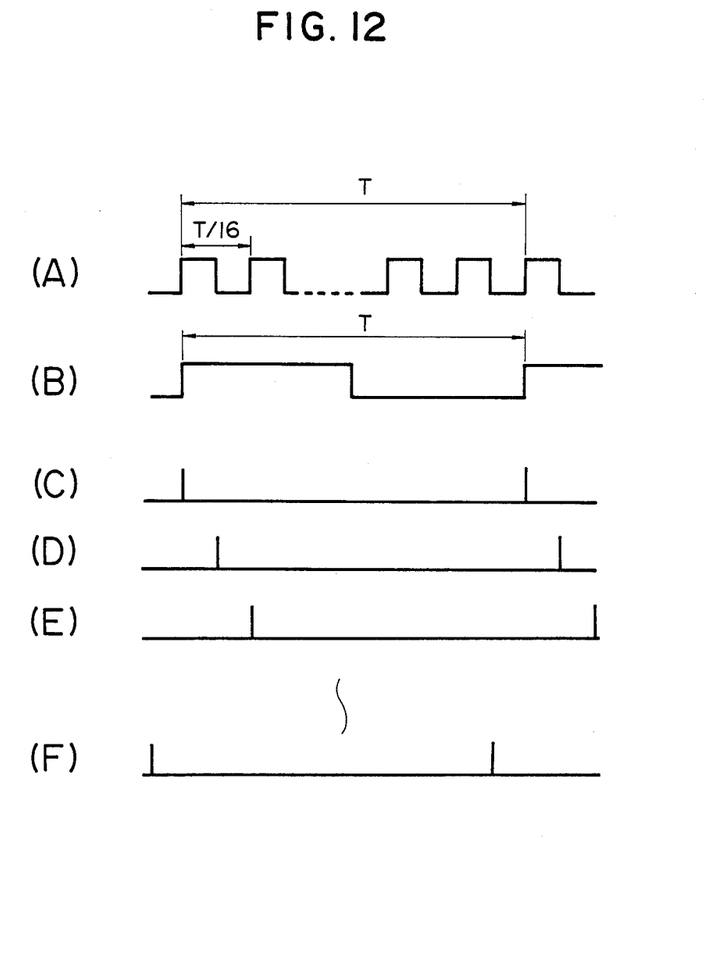
FIG. 12 is a timing chart illustrating the work of the device indicated in FIG. 11.

FIG. 11 illustrates another embodiment of the present invention. In this embodiment, the delay using delay lines and the method, by which one of the triggers of harmonic waves is selected, are combined. This embodiment will be explained, supposing that the same measurement is effected as that of the embodiment explained referring to FIG. 10. The fundamental frequency (39 MHz) is produced in a fundamental clock generator 40 controlled by the control computer 23. One of the outputs of the fundamental clock generator 40 enters a frequency divider 39. The fundamental frequency is transformed into a frequency whose period is four times as long as that of the fundamental frequency (period: 409.5 ns, frequency: 2.44 MHz). The driving power source 11 is periodically driven by using the divided frequency as triggers so that it irradiates periodically the sample 10 (LSI) with an electron beam. The other output of the fundamental clock generator 40 enters a trigger circuit 41, which generates triggers as indicated in FIG. 12 (C)-(F). FIGS. 12 (A) and (B) indicate the fundamental frequency and the divided frequency, respectively. The trigger circuit 41 selects successively triggers (C), (D), (E), . . . , (F) according to a command from the control computer 23. This trigger signals errors in the phase shifter 5. The order of the phases to be scanned will now be explained. At first the delay given by the phase shifter 5 is 0 and the trigger circuit 41 selects 16 pulses (C)-(F). Data are taken in the channels 0, 64, 128, . . . , 960 of the memory. Next the phase shifter 5 gives a delay of 0.4 ns. Triggers are selected in the same way and data are taken in the channels 1, 65, 129, . . . , 961 of the memory. After that the phase shifter 5 gives a delay of 0.8 ns, triggers are selected similarly, and data are taken in the channels 2, 66, 130, . . . , 962 of the memory. The scanning is continued is this way, unitil the channels 63, 127, . . . , 1023 of the memory are filled and a whole waveform can be obtained.

According to this invention, the problem of the waveform distortion produced by LSIs covered with the passivation film is resolved and a remarkable effect for the development of LSIs can be obtained.

I claim:

1. A stroboscopic type potential measurment device comprising:
    a charged particle beam projecting means for irradiating a sample with a charged particle pulsed beam synchronized with a periodically varying voltage in said sample;
    a phase shifter means for varying the phase of said charged particle pulsed beam with respect to said periodically varying voltage in said sample; and
    a potential measurement means for detecting secondary electrons emitted by said sample irradiated with said charged particle pulsed beam and for measuring a waveform of said periodically varying voltage at a location irradiated with said charged particle pulsed beam;
    whereby said potential measurement means regulates the phase of said charged particle pulsed beam with respect to the phase of said periodically varying voltage in said sample using said phase shifter means and effects at least two sorts of measurements having different phase division pitches, a measurement of siad potential being so effected that a measurement result is formed by correcting a measurement result obtained by using a fine phase division on the basis of a measurement obtained by using a coarse phase division.

2. A stroboscopic type potential measurement device according to claim 1, wherein said potential measurement means effects corrections of measurement results at certain points for the fine phase division, based on results at two points for said coarse phase division, which are adjacent to a relevant point for said fine phase division.

3. A stroboscopic type potential measurement device according to claim 1, wherein said potential measurement means effects corrections of measurement results at relevant points for said fine phase division based on a logarithmic approximation using measurement results for said coarse phase division.

4. A stroboscopic type potential measurement device comprising:
    a charged particle beam projecting means for irradiating a sample with a charged particle pulsed beam synchronized with a periodically varying voltage in said sample;
    a phase shifter means for varying the phase of said charged particle pulsed beam with respect to said periodically varying voltage in the sample; and
    a potential measurement means for detecting secondary electrons emitted by said sample irradiated with said charged particle pulsed beam and for measuring a waveform of said periodically varying voltage at a location irradiated with said charged particle pulsed beam;
    whereby said potential measurement means regulates the phase of said charged particle pulsed beam with respect to the phase of said periodically varying voltage in said sample using said phase shifter means and repeats a plurality of phase scannings, having a coarse phase division pitch, at different phases which are respectively shifted from a first phase scanning for interpolating an interval of said coarse phase division pitch of each of said phase scannings, a measurement being so effected that a measurement result is formed by combining measurement results of said phase scannings.

5. A stroboscopic type potential measurement device according to claim 4, wherein said waveform of a periodically varying voltage is measured for a whole phase region by repeating said phase scanning having a coarse phase division pitch for every fine phase division pitch.

* * * * *